United States Patent

Kamada et al.

Patent Number: 6,036,912
Date of Patent: Mar. 14, 2000

[54] PRODUCTION METHOD FOR CERAMIC GREEN SHEET

[75] Inventors: Akihiko Kamada; Isao Kato, both of Shiga-ken; Norio Sakai, Moriyama, all of Japan

[73] Assignee: Murata Manufacturing Co., Ltd., Japan

[21] Appl. No.: 09/316,495

[22] Filed: May 21, 1999

[30] Foreign Application Priority Data

May 26, 1998 [JP] Japan ................................. 10-144041

[51] Int. Cl.[7] ......................................................... B28B 1/00
[52] U.S. Cl. ............................ 264/430; 264/439; 264/650
[58] Field of Search ..................................... 264/430, 439, 264/650

[56] References Cited

U.S. PATENT DOCUMENTS

| | | | |
|---|---|---|---|
| 3,673,296 | 6/1972 | Timko | 264/24 |
| 4,826,616 | 5/1989 | Tanino et al. | 252/62.9 |

*Primary Examiner*—Christopher A. Fiorilla
*Attorney, Agent, or Firm*—Ostrolenk, Faber, Gerb & Soffen, LLP

[57] ABSTRACT

Provided is a production method and a production apparatus for a ceramic green sheet, capable of achieving a thin layer without using an aqueous or organic solvent. The method of producing a ceramic green sheet includes a first step of charging a carrier sheet, a second step of attaching chargeable powder charged in the polarity opposite to that of the carrier sheet, on the surface of the carrier sheet by electrostatic force, and a third step of applying heat to the chargeable powder attached on the surface of the carrier sheet by electrostatic force so as to fix the chargeable powder onto the surface of the carrier sheet.

6 Claims, 4 Drawing Sheets

PRODUCTION METHOD FOR CERAMIC GREEN SHEET

BACKGROUND OF THE INVENTION

1. Field of the Invention

The present invention relates to a production method and a production apparatus for a ceramic green sheet for use in a ceramic electronic part comprising a circuit of an electronic appliance.

2. Description of the Related Art

Conventionally, a ceramic green sheet for use in a ceramic electronic part, represented for instance by a laminated capacitor, a laminated inductor, a laminated LC filter and a multi-layer substrate, has been produced with known production apparatus by kneading a mixture of an aqueous or organic solvent wherein ceramic powders such as barium titanate and ferrite are dissolved and a polymeric binder such as polymethyl methacrylate (PMMA), polyvinyl butylal (PVB) and polyvinyl alcohol (PVA) with a high speed mixer or a ball mill, applying the obtained ceramic slurry onto the surface of a carrier sheet such as a polyethylene terephthalate (PET) film at a thickness of several hundred μm to several ten μm thickness by a doctor blade method or a rolling method, drying and winding the same.

FIG. 1 is a configuration diagram of a production apparatus for a ceramic green sheet used in a conventional method of producing a ceramic green sheet. As shown in FIG. 1, a carrier sheet 51 applied with a liquid mold releasing agent is sent out from a dispatch part 52 and is placed between a pair of roller parts 53a, 53b so as to be moved horizontally. The surface 511 of the carrier sheet 51 has a ceramic slurry 55 applied from an applying part 54 when it passes immediately below the applying part 54. The ceramic slurry 55 can be obtained by adding a polymer binder into an aqueous or organic solvent with ceramic powders dispersed therein and kneading as mentioned above. The applying part 54 is provided with a doctor blade 57 at a height set with respect to a base part 56 for supporting the rear surface 512 of the carrier sheet 51 so that the thickness of the ceramic slurry 55 on the surface of the carrier sheet 51 can be made homogeneous by evening the ceramic slurry 55 on the surface 511 of the carrier sheet 51 with the doctor blade 57. Then, the ceramic slurry 55 on the surface 511 of the carrier sheet 51 is dried sufficiently while passing immediately below a drying part 58, and is taken up by a winding part 60 as a ceramic green sheet 59 with the carrier sheet 51 as shown in a broken circle in FIG. 1.

Although it is not shown in the figure, the taken-up ceramic green sheet 59 with the carrier sheet 51 is rewound, cut in a desired width, and the ceramic green sheet is removed from the carrier sheet 51. After forming an electrode pattern by printing a conductive paste on these ceramic green sheets by a screen printing method, a heat and pressing treatment is applied to a plurality of laminated ceramic green sheets so as to obtain a ceramic laminated product. By baking a ceramic laminated product accordingly obtained, and forming an external electrode at the end part, a ceramic electronic part can be obtained.

As mentioned above, a ceramic slurry obtained by kneading a mixture of an aqueous or organic solvent with ceramic powders dispersed therein and a polymer binder, is used in the conventional method of producing a ceramic green sheet.

When an aqueous solvent is used, although a means for preventing an explosive shock is not required in the drying part for drying the ceramic slurry, a problem is involved in that the polymer binder cannot be dispersed well in water, and thus it exists in the state of fine particles, and it is difficult to have a formed ceramic green sheet with a homogeneous density, and thus it is not suitable for achieving a thin ceramic green sheet.

When an organic solvent is used, although the binder can be dispersed well, and thus it is easy to achieve a thin ceramic green sheet, a problem is involved in that a means for preventing an explosive shock is required in the drying part for drying a ceramic slurry, and thus expensive production equipment is needed.

SUMMARY OF THE INVENTION

The present invention is for solving these problems, and an object thereof is to provide a production method and a production apparatus for a ceramic green sheet, capable of achieving a thin layer without using an aqueous or organic solvent.

One preferred embodiment of the present invention provides a method of producing a ceramic green sheet comprising the step of attaching chargeable powder containing ceramic powders, a charge controller and a thermoplastic resin onto the surface of a carrier sheet by the electrostatic force.

Since the chargeable powder containing ceramic powders, a charge controller and a thermoplastic resin is attached onto the surface of a carrier sheet by the electrostatic force, unlike the conventional wet type method of producing a ceramic green sheet, a ceramic slurry containing an aqueous or organic solvent need not be used. Therefore, a wet ceramic green sheet need not be dried and the means for preventing an explosion shock is not required for the production apparatus, the production apparatus can be realized at a low cost, and thus the production cost can be lowered.

The above described method may comprise the steps of: a first step of charging the carrier sheet, preferably homogeneously; a second step of attaching the chargeable powder charged in the polarity opposite to that of the carrier sheet onto the surface of the carrier sheet; and a third step of fixing the chargeable powder onto the surface of the carrier sheet by heating the chargeable powder attached on the surface of the carrier sheet.

Since the chargeable powder containing ceramic powder, preferably homogeneously charged positively, is attached onto the surface of the carrier sheet homogeneously charged, e.g., negatively, the chargeable powder can be attached onto the surface of the carrier sheet thinly and homogeneously. Therefore, a thin layer and homogeneity can be realized in the ceramic green sheet.

In the above described method, an intermediate medium comprising an insulating substance may be used as a device for attaching the chargeable powder onto the surface of the carrier sheet in the second step.

When an intermediate medium comprising an insulating substance is used as a device for attaching the chargeable powder onto the surface of the carrier sheet in the second step, a thin layer can be realized in the ceramic green sheet by controlling the distance between the intermediate medium and the carrier sheet.

In the above described method, a heat roller may be used as a device for fixing the chargeable powder onto the surface of the carrier sheet by heating the chargeable powder attached on the surface of the carrier sheet in the third step.

According to the above described method, the surface of the ceramic green sheet can be evened by pressing the same by heat rollers from above.

Another preferred embodiment of the present invention provides a production apparatus for a ceramic green sheet comprising: a charging device for charging a carrier sheet; an attaching device for sprinkling or otherwise applying chargeable powder charged in the polarity opposite to that of the carrier sheet onto the surface of the carrier sheet for attaching by electrostatic force; and a fixing device for fixing the chargeable powder attached on the surface of the carrier sheet.

According to the above described production apparatus, since a fixing device for fixing by heat the chargeable powder attached on the surface of the charged carrier sheet by the electrostatic force is provided, an anti-explosion measure is not required for the fixing device. Therefore, the production apparatus can be realized at a low cost, and thus the production cost can be lowered.

Other features and advantages of the present invention will become apparent from the following description of the invention which refers to the accompanying drawings.

DESCRIPTION OF THE PREFERRED EMBODIMENTS

Figure 1:
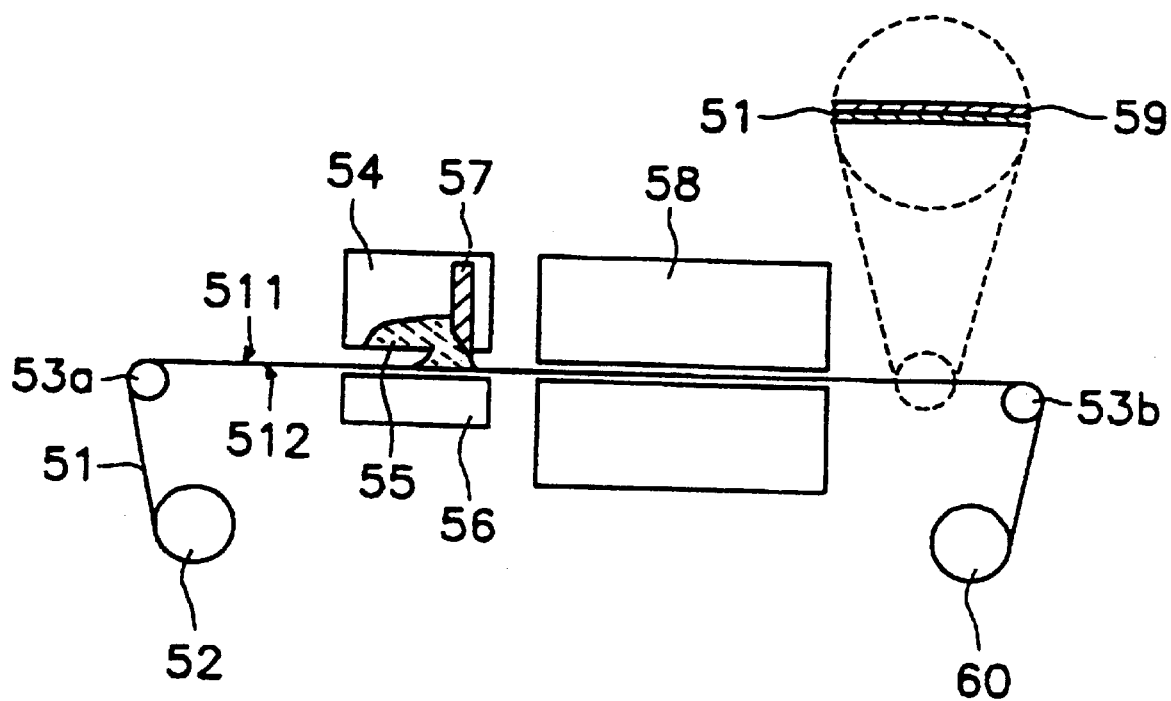
FIG. 1 is a configuration diagram of a production apparatus to be used for the conventional method of producing a ceramic green sheet.
Figure 2:
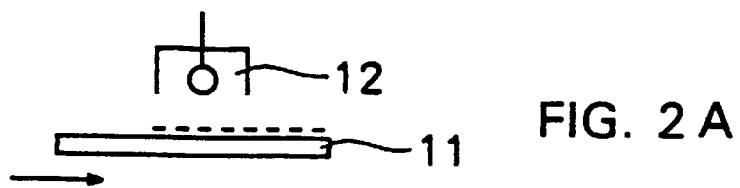
FIGS. 2A to 2C are diagrams showing the process of a first preferred embodiment of a method of producing a ceramic green sheet according to the present invention.
Figure 2:
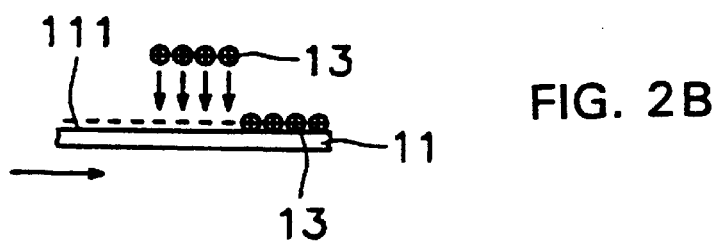
Figure 2:
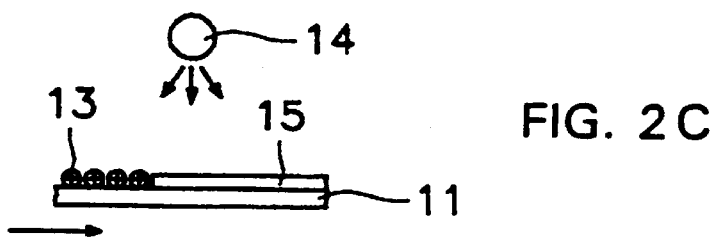

FIGS. 2A to 2C are diagrams showing the process of the first preferred embodiment of a method of producing a ceramic green sheet according to the present invention. As shown in FIG. 2A, a carrier sheet 11 comprising a PET film is charged negatively with a corona charger 12 in the first step.

As shown in FIG. 2B, a chargeable powder 13 charged positively, that is, in the polarity opposite to that of the carrier sheet 11, is attached on the surface 111 of the carrier sheet 11 by the electrostatic force in the second step.

Then, as shown in FIG. 2C, heat is applied by the flash lamp 14 irradiation to the chargeable powder 13 attached on the surface 111 of the carrier sheet 11 by the electrostatic force so as to fix the chargeable powder 13 onto the surface 111 of the carrier sheet 11 in the third step.

According to the steps shown above, a ceramic green sheet 15 with the carrier sheet 11 can be obtained.

Figure 3:
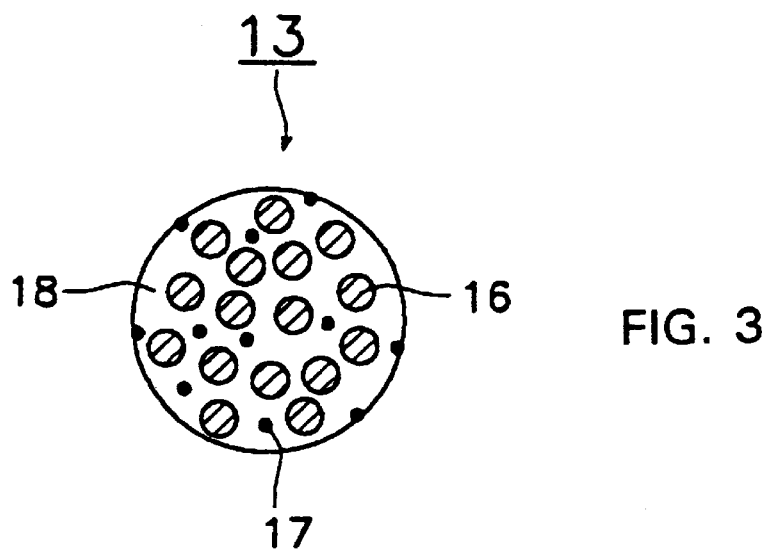
FIG. 3 is a cross-sectional view of a chargeable powder to be used for the method of producing a ceramic green sheet of FIGS. 2A to 2C.

FIG. 3 is a cross-sectional view of a chargeable powder to be used in the method of producing a ceramic green sheet of FIGS. 2A to 2C. The chargeable powder 13 can be obtained by mixing ceramic powders 16 made from, for example, barium titanate, a charge controller 17 made from, from example, an azo metallic dye, and a thermoplastic resin 18 made from, for example, a styrene acrylic copolymer in a 90:1:9 weight ratio so as to homogeneously disperse the ceramic powders 16 and the charge controller 17 in the thermoplastic resin 18.

Figure 4:
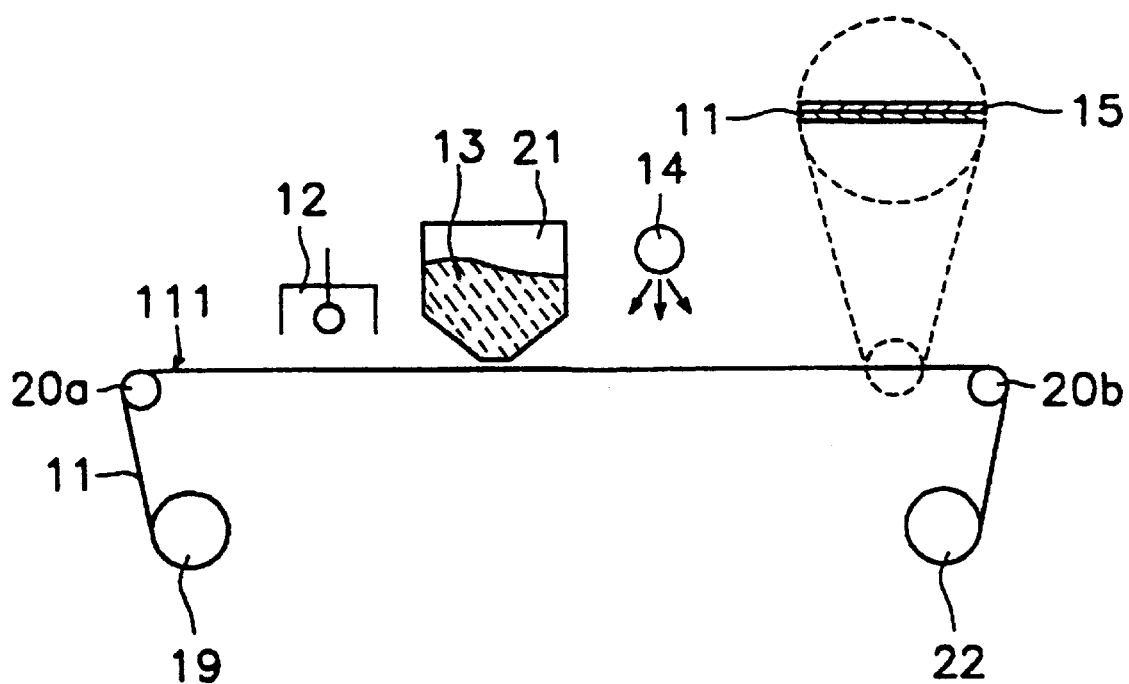
FIG. 4 is a configuration diagram of a production apparatus to be used for the method of producing a ceramic green sheet of FIGS. 2A to 2C.

FIG. 4 is a configuration diagram of a production apparatus to be used for the method of producing a ceramic green sheet of FIGS. 2A to 2C. As shown in FIG. 4, the carrier sheet 11 sent out from a dispatch part 19 is placed between a pair of roller parts 20a, 20b so as to be moved horizontally. The carrier sheet 11 is charged negatively by a corona charger 12 when it passes below the corona charger 12.

When the surface 111 of the negatively charged carrier sheet 11 passes below a chargeable powder supply device 21, chargeable powder 13 positively charged, that is, in the polarity opposite to that of the carrier sheet 11, which are contained in the chargeable powder supply device 21, are sprinkled thereto so that the chargeable powder 13 is attached on the surface of the carrier sheet 11 by electrostatic force.

Then, by heating the chargeable powder 13 attached on the surface of the carrier sheet 11 by electrostatic force by a flash lamp 14 irradiation when it passes below a flash lamp 14 for melting the thermoplastic resin 18 comprising the chargeable powder 13, the chargeable powder is fixed on the surface 111 of the carrier sheet 11. As shown in an enlarged view in the broken circle of FIG. 4, a ceramic green sheet 15 with the carrier sheet 11 accordingly is obtained, and is taken up by a winding part 22.

It was confirmed that the thickness of the ceramic green sheet 15 obtained with the production device shown in FIG. 4 is about 15 $\mu$m.

Figure 5:
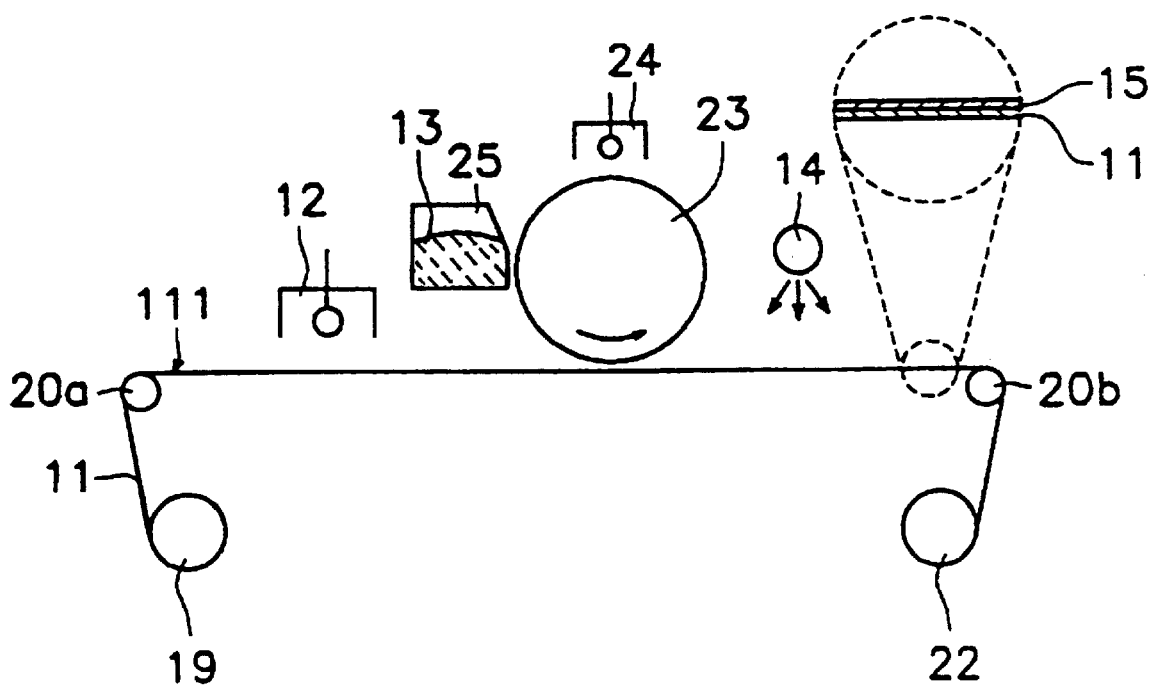
FIG. 5 is a configuration diagram of another production apparatus to be used for the method of producing a ceramic green sheet of FIGS. 2A to 2C.

FIG. 5 is a configuration diagram of another production apparatus to be used for the method of producing a ceramic green sheet of FIGS. 2A to 2C. The production apparatus differs from the production apparatus of FIG. 4 in that positively charged powder 13 are attached on the surface of the carrier sheet 11 via an intermediate medium comprising an insulating substance, such as polyurethane, polypropylene or the like by the electrostatic force.

As shown in FIG. 5, the carrier sheet 11 sent out from the dispatch part 19 is placed between a pair of the roller parts 20a, 20b so as to be moved horizontally. The carrier sheet 11 is charged negatively by the corona charger 12 when it passes below the corona charger 12.

Then, positively charged powder 13 is supplied from a chargeable powder supply device 25 onto the surface of an intermediate medium 23 negatively charged by a corona charger 24. The chargeable powder 13 is attached onto the surface of the carrier sheet 11 by the electrostatic force when the carrier sheet 11 negatively charges passes below the intermediate medium 23.

Then, by heating the chargeable powder 13 attached on the surface of the carrier sheet 11 by the electrostatic force by the flash lamp 14 irradiation when it passes below a flash lamp 14 for melting the thermoplastic resin 18 comprising the chargeable powder 13, the chargeable powder is fixed on the surface 111 of the carrier sheet 11. As shown in an enlarged view in the broken circle of FIG. 5, a ceramic green sheet 15 with the carrier sheet 11 is accordingly obtained and is taken up by a winding part 22.

According to the above-mentioned first preferred embodiment of the method of producing a ceramic green sheet, since chargeable powder containing ceramic powders, a charge controller and a thermoplastic resin are attached onto the surface of the carrier sheet by electrostatic force, unlike the conventional wet type method of producing a ceramic green sheet, a ceramic slurry containing an aqueous or organic solvent need not be used. Therefore, since the ceramic green sheet need not be dried and the anti-explosion measure is not required for the production apparatus, the production apparatus can be realized at a low cost, and thus the production cost can be lowered.

Moreover, since chargeable powder containing ceramic powders positively charged are attached onto the surface of the carrier sheet negatively charged homogeneously, the chargeable powder can be attached onto the surface of the carrier sheet thinly and homogeneously. Therefore, a thin layer and a homogeneity can be realized in the ceramic green sheet.

Furthermore, as shown in FIG. 5, when an intermediate medium is used as a means for attaching the chargeable powder onto the carrier sheet in the second step, a thin layer can be realized in the ceramic green sheet by controlling the distance between the intermediate medium and the carrier sheet. The thickness of the ceramic green sheet 15 obtained with the production apparatus of FIG. 5 is about 5 μm.

Moreover, since the production apparatus of a ceramic green sheet shown in FIGS. 4 and 5 has a fixing means for fixing by heat the chargeable powder attached on the surface of the charged carrier sheet by the electrostatic force, an anti-explosion measure is not needed for the fixing means. Therefore, the production apparatus can be produced at a low cost and the production cost can be lowered.

Figure 6A:
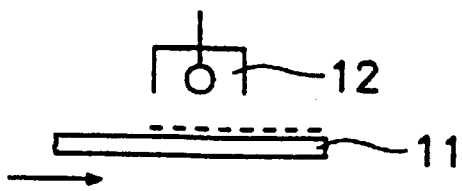
FIGS. 6A to 6C are diagrams showing the process of a second preferred embodiment of a method of producing a ceramic green sheet according to the present invention.
Figure 6B:
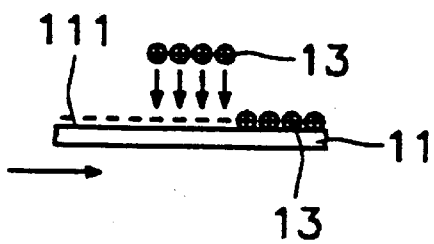
Figure 6C:
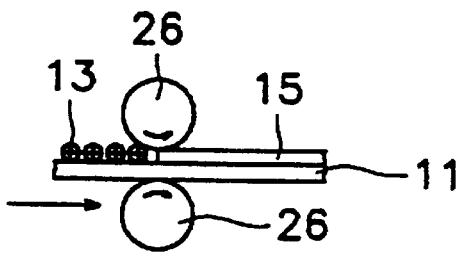

FIGS. 6A to 6C are diagrams showing the process of a second preferred embodiment of a method of producing a ceramic green sheet according to the present invention. The production method differs from the method of producing the first preferred embodiment shown in FIGS. 2A to 2C in that the chargeable powder 13 attached on the surface of the carrier sheet 11 are fixed to the surface of the carrier sheet 11 by the heat of heat rollers 26 in the third step (FIG. 6C).

Since the first and second steps (FIGS. 6A, 6B) are the same as those of the first embodiment of the method of producing a ceramic green sheet shown in FIGS. 6A to 6C, detailed explanation is not provided herein.

Figure 7:
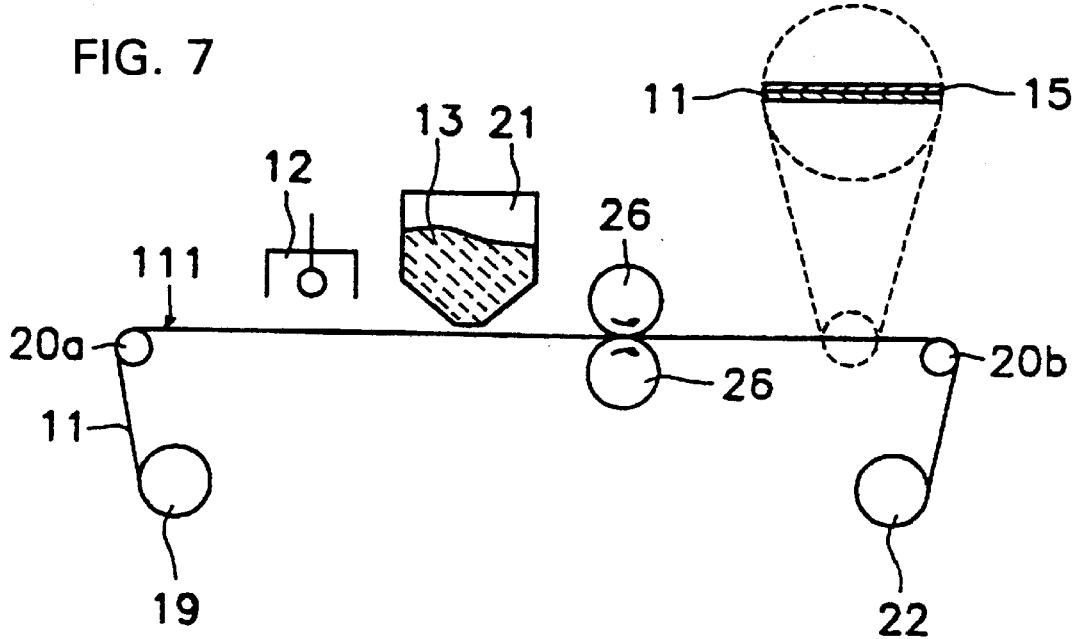
FIG. 7 is a configuration diagram of a production apparatus to be used for the method of producing a ceramic green sheet of FIGS. 6A to 6C.

FIG. 7 is a configuration diagram of the production apparatus to be used for the method of producing a ceramic green sheet of FIGS. 6A to 6C. The production apparatus differs from the production apparatus of FIG. 4 in that the heat rollers 26 are used in place of the flash lamp (FIG. 4) as a means for fixing the chargeable powder 13 to the surface of the carrier sheet 11 by heating the chargeable powder 13 attached on the surface of the carrier sheet 11.

That is, the chargeable powder 13 is fixed on the surface of the carrier sheet 11 by passing the carrier sheet 11 with the chargeable powder 13 attached on the surface thereof between the heat rollers 26 so as to heat the chargeable powder 13 attached on the surface of the carrier sheet 11 for melting the thermoplastic resin 18 comprising the chargeable powder 13.

As in the production apparatus of FIG. 5, an intermediate medium comprising an insulating substance can be used in the second step as a means for attaching the chargeable powder 13 on the surface of the carrier sheet 11.

According to the above-mentioned second preferred embodiment of the method of producing a ceramic green sheet, since the heat rollers are used in the third step as a means for fixing the chargeable powder onto the carrier sheet by melting the thermoplastic resin comprising the chargeable powder by heating the chargeable powder attached on the surface of the carrier sheet, the surface of the ceramic green sheet can be evened.

Moreover, according to the production apparatus of a ceramic green sheet shown in FIG. 7, since a fixing means for fixing by heat the chargeable powder attached on the surface of the charged carrier sheet by the electrostatic force is included, the anti-explosion measure is not required in the fixing means. Therefore, the production apparatus can be realized at a low cost, and the production cost can be lowered.

Furthermore, although the case of charging the carrier sheet by the corona charger from above at the time of homogeneously charging the carrier sheet in the first step was explained in the above-mentioned production methods of a ceramic green sheet of the first and second embodiments, the same effect can be achieved by charging the carrier sheet by the corona charger from below.

Moreover, in the case of attaching the chargeable powder on the surface of the carrier sheet via an intermediate medium comprising an insulating substance as in the production apparatus of FIG. 5, the same effect can be achieved by providing the corona charger for charging the carrier sheet immediately below the intermediate medium via the carrier sheet for charging the carrier sheet and attaching the chargeable powder onto the carrier sheet simultaneously.

Furthermore, although the case of attaching the chargeable powder onto the surface of the carrier sheet, the intermediate medium comprising an insulating substance has been explained with the production apparatus of FIG. 5, the same effect can be achieved with an intermediate medium comprising an inorganic material such as selenium, tellurium, amorphous silicon or the like, or a photosensitive member comprising an organic conductor (OPC) material.

While the invention has been particularly shown and described with reference to preferred embodiments thereof, it will be understood by those skilled in the art that the forgoing and other changes in form and details may be made therein without departing from the spirit of the invention.

What is claimed is:

1. A method of producing a ceramic green sheet comprising the step of attaching a chargeable powder comprising ceramic powder, charge controller and thermoplastic resin onto the surface of a carrier sheet by electrostatic force.

2. The method according to claim 1, comprising the steps of:

charging the carrier sheet;

applying the chargeable powder charged in the polarity opposite to that of the carrier sheet onto the surface of the carrier sheet; and fixing the chargeable powder onto the surface of the carrier sheet by heating the chargeable powder attached on the surface of the carrier sheet.

3. The method according to claim 2, wherein the step of applying the chargeable powder charged in the polarity opposite to that of the carrier sheet onto the surface of the carrier sheet comprises transfer from an intermediate medium comprising an insulating substance.

4. The method according to claim 2, wherein a heat roller is used for fixing the chargeable powder onto the surface of the carrier sheet by heating the chargeable powder attached on the surface of the carrier sheet in the third step.

5. The method according to claim 4, wherein the carrier sheet is charged negatively and the chargeable powder is charged positively.

6. The method according to claim 2, wherein the carrier sheet is charged negatively and the chargeable powder is charged positively.

\* \* \* \* \*